US 7,084,438 B2

(12) United States Patent
Plikat et al.

(10) Patent No.: US 7,084,438 B2
(45) Date of Patent: *Aug. 1, 2006

(54) METAL INSULATOR POWER SEMICONDUCTOR COMPONENT (MIS) AND A METHOD FOR PRODUCING THE SAME

(75) Inventors: Robert Plikat, Eningen (DE); Wolfgang Feiler, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 182 days.

This patent is subject to a terminal disclaimer.

(21) Appl. No.: 10/474,614

(22) PCT Filed: Apr. 3, 2002

(86) PCT No.: PCT/DE02/01196

§ 371 (c)(1),
(2), (4) Date: Apr. 6, 2004

(87) PCT Pub. No.: WO02/084743

PCT Pub. Date: Oct. 24, 2002

(65) Prior Publication Data

US 2004/0155285 A1     Aug. 12, 2004

(30) Foreign Application Priority Data

Apr. 10, 2001   (DE) ................. 101 17 802

(51) Int. Cl.
*H01L 29/32* (2006.01)

(52) U.S. Cl. ............... 257/107; 257/E29.211; 257/E29.216

(58) Field of Classification Search ........... 257/107, 257/E29.211, E29.216
See application file for complete search history.

(56) References Cited

U.S. PATENT DOCUMENTS

| 5,216,275 A | 6/1993 | Chen |
| 6,674,125 B1 * | 1/2004 | Feiler et al. ............... 257/339 |

FOREIGN PATENT DOCUMENTS

| DE | 196 04 043 | 8/1997 |
| DE | 197 36 981 | 8/1998 |
| DE | 198 16 448 | 9/1999 |
| DE | 198 40 032 | 11/1999 |

OTHER PUBLICATIONS

B.J. Baliga, Power Semiconductor Devices, 1995, pp. 543-568.

(Continued)

*Primary Examiner*—George Fourson
*Assistant Examiner*—Thanh V. Pham
(74) *Attorney, Agent, or Firm*—Kenyon & Kenyon LLP

(57) ABSTRACT

A semiconductor power component having an anode contact on the reverse side, an emitter region of a first conductor type on the reverse side, which is connected to the anode contact on the reverse side, a drift zone which is connected to the emitter region that is on the reverse side and extends partially to the front surface, an MOS control structure on the front side, having a control contact positioned in insulated fashion, a cathode contact on a front side which is connected to a source region and a first body region. The drift zone has first and second drift region of a second conductor type and a third drift region of first conductor type. First drift region is a buried region, second drift region connects the front surface to first drift region, and third drift region connects the first and/or second body region to first drift region. The degree of compensation ($K(y)$) that is ascertainable from the second and third drift region is greater than one and has a maximum in the region of the side of the third drift region facing away from the front surface.

6 Claims, 9 Drawing Sheets

OTHER PUBLICATIONS

M.S. Shekar et al., Power Semiconductor Devices and ICS, 1991, pp. 128-131.

N. Iwamuro et al., Power Semiconductor Devices and ICS, 1993, pp. 71-76.

* cited by examiner

METAL INSULATOR POWER SEMICONDUCTOR COMPONENT (MIS) AND A METHOD FOR PRODUCING THE SAME

This application is a 371 of PCT/DE02/01196 dated Apr. 3, 2002, claimed foreign priority of GERMANY 101 17 802.6 dated Apr. 10, 2001.

FIELD OF THE INVENTION

The present invention relates to a semiconductor power component and a corresponding manufacturing method. The present invention is explained with respect to an EST (emitter switched thyristor), but it is also applicable to other, similar semiconductor power components.

BACKGROUND INFORMATION

In general, it is believed that EST's are used as circuit breakers in the range of a few hundred to a few thousand volt blocking voltage. The use of such EST's as ignition transistor, i.e. as switch on the primary side of an ignition coil is of particular interest.

It is believed that the structure of the EST comes about from that of available V-IGBT's (vertical insulated gate bipolar transistor) by adding additional floating emitter structures, shielded by diffusion regions, on the upper side of the chip. The advantage of EST's compared to V-IGBT's is generally seen in better forward current behavior, i.e. a lower voltage drop in the switched-on state. As in the case of V-IGBT, the terminal connected to the reverse side emitter is denoted as the anode, the gate terminal as the gate, and the connection to the source and body diffusions as the cathode.

As is purportedly discussed in B. J. Baliga, Power Semiconductor Devices, PWS Publishing Company, Boston 1995, pp. 543–568, with regard to the design of MOS control heads, there are essentially two types of EST, whose active area is made up of a plurality of parallel connected strip-shaped or cell-shaped MOS control heads and floating emitter structures.

The first type is the so-called single channel EST (SC-EST), whose half cell cross section 100 is shown in FIGS. 7 and 9. The second type is the so-called dual channel EST (DC-EST), whose half cell cross section 200 is shown in FIGS. 8 and 10.

As in the V-IGBT, with respect to the design of the emitter on the reverse side of the chip, there are essentially two types, the punch-through type (PT type) whose half cell cross section 300 is shown in FIGS. 9 and 10, and the non-punch-through type (NPT type), whose half cell cross section 400 is shown in FIGS. 7 and 8, Thus there are therefore the following four basic types of vertical EST's, made up of the combination of these described design possibilities: the SC-NPT EST (FIG. 7), the SC-PT EST (FIG. 9), the DC-NPT EST (FIG. 8) and the DC-PT EST (FIG. 10).

Referring to FIG. 7, the functioning procedure in the forward current case is the following for the SC-NPT EST.

In this SC-NPT EST, gate 103, usually made of polysilicon, is composed, per half cell, of two parts which are connected to each other via the third dimension (not shown). The gate, which is insulated from the semiconductor only by a thin gate oxide layer 109, is brought to a potential above the voltage level of MOS control heads 106, 107, 108, 160, 180 with respect to cathode 101, whose metallization is at a reference potential. Intermediate oxide layer 110 is used for insulating cathode 101 from gate 103. Thereupon, in the region of the p-type areas (p-type body area 108, p-type area 180), inversion channels are generated at the HL semiconductor surface under gate 103, and the semiconductor surface is brought into accumulation in the vicinity of n⁻-doped drift zone 104. In the case of the positive anode voltage at the metallization of anode 102 on the back of the chip with respect to cathode 101, electrons are injected via n⁺-regions 106, 160, the electrostatically induced MOS channels and the accumulation layer into n⁻-drift zone 104. Thereupon p⁺-doped emitter 105 on the anode side injects holes into n⁻-drift zone 104, which leak away via p-regions 180, 108 and p⁺-contact region 107 to cathode 101.

Beginning at a certain current density, because of the lateral voltage drop caused by the hole current proportion in p-region 180, the p-n junction between n⁺-region 160 and p-region 180 is polarized in the forward direction, whereby electrons are injected transversely via p-region 180 into drift zone 104 from n⁺-region 160 currently acting as an emitter, without first having to pass the MOS channel lying under the right-hand gate part.

The now active four-layer structure made up of n⁺-region 160, p-region 180, n⁻-drift zone 104 and p⁺-emitter 105 on the reverse side, acts as a thyristor whose n⁺-emitter 160 is supplied with electrons via n⁺-region 106 and the MOS channel formed under the left-hand part of gate 103, and thus may be switched or controlled with the aid of gate 103.

As compared to a normal thyristor, the EST accordingly has the advantage that, by the drop in the gate cathode voltage below the threshold voltage, it can be turned off and the current flowing through it is controllable by the gate voltage. Its forward current characteristic curve thus shows a current saturation range.

In forward current operation, n⁻-drift zone 104 is flooded in such a way by charge carriers that its conductivity is increased. At the usual forward current densities it is at high-level injection. Intermediate oxide layer 110 is used for insulating cathode 101 from gate 103.

The method of functioning of SC-PT EST 300, shown in FIG. 9, in the forward current case is analogous to the SC-NPT EST. In the SC-PT EST an additional n-buffer layer 150 is present, whose function will be explained in connection with the blocking case. Because of n-buffer layer 150 it is possible to reduce the thickness of n⁻-drift zone 104, in order to achieve better forward current characteristics. The SC-PT EST may be produced, for example, on a p⁺-substrate having an emitter 105 on the reverse side, n-buffer layer 150 and n⁻-drift zone 104 being grown epitaxially on this p⁺-substrate.

The method of functioning of DC-PT EST 200, as in FIG. 8, in the forward current case is similar to that of SC-PT EST 300 as in FIG. 9.

In the case of DC-PT EST 200, gate 103, which is usually made of polysilicon, has only one part per half cell. Gate 103, insulated from the semiconductor surface only by a thin gate oxide layer 109 is brought to a potential above the voltage level of MOS control heads 106, 107, 108, 160, 180 with respect to cathode 101, whose metallization is at a reference potential. Thereupon, in the region of the p-type areas (p-type body area 108, p-type area 180), inversion channels are generated under gate 103, and the semiconductor surface is brought into accumulation in the vicinity of n⁻-doped drift zone 104. In the case of the positive anode voltage at the metallization of anode 102 on the back of the chip with respect to cathode 101, electrons are injected via n⁺-regions 106, the left-hand electrostatically induced MOS channels and the accumulation layer into n-drift zone 104.

Thereupon p$^+$-doped emitter 105 on the anode side injects holes into n$^-$-drift zone 104, which leak away, on the one hand via p$^+$-contact region 107 and p-body region 108, and on the other hand via p$^+$-contact region 107 and via p-zones 180, 108 and the part of drift zone 104 lying between them, to cathode 101. Beginning at a certain current density, because of the lateral voltage drop caused by the hole current proportion in p-region 180 and the laterally bordering part of n-drift zone 104, the p-n junction between n$^+$-region 160 and p-region 180 is polarized in the flow direction, whereby electrons are injected transversely via p-region 180 into n-drift zone 104 from n$^+$-region 160 currently acting as an emitter, after first passing the MOS channels and the accumulation layer lying under the gate.

The now active four-layer structure made up of n$^+$-region 160, p-region 180, n$^-$-drift zone 104 and p$^+$-emitter 105 on the reverse side, acts as a thyristor whose n$^+$-emitter 160 is supplied with electrons via n$^+$-region 106 and the channel formed under gate 103, and thus may be switched or controlled with the aid of the gate.

In forward current operation, n$^-$-drift zone 104 is flooded in such a way by charge carriers that its conductivity is increased. At the usual forward current densities it is at high-level injection.

Compared to the single channel EST's described farther above, dual channel EST's have the advantage of a further extended, secure working range in the forward direction (FBSOA).

The method of functioning of DC-PT-NPT, as in FIG. 10, is completely analogous to the DC-NPT EST. In the DC-PT EST, additional n-buffer layer 150 is present, whose function will be explained in connection with the blocking case. Because of n-buffer layer 150 it is possible to reduce the thickness of n$^-$-drift zone 104, in order to optimize forward current characteristics. A DC-PT EST may be manufactured analogously to the SC-PT EST.

In the blocking case, in the case of the SC-NT EST as in FIG. 7 and the DC-NPT EST as in FIG. 8, gate 103 is brought to a voltage below the threshold voltage level compared to cathode 101. If anode 102 is now brought to a positive potential, the space charge region developed at the border between p-regions 108, 180 and n$^-$-drift zone 104 expands almost exclusively into n$^-$-drift zone 104. The thickness of n$^-$-drift zone 104 is selected to be greater than the width the space charge region has at a given maximum blocking ability of the component, which is substantially determined by the drift region doping. This leads to the triangular pattern of the electrical field strength |E| along the y-coordinate, indicated in FIG. 7 and FIG. 8. In this context, the maximum of the field strength is in the range of MOS control heads 106, 107, 108, 160, 180.

The blocking case for the SC-PT EST as in FIG. 9 and the DC-PT EST as in FIG. 10 may be described as follows. In these PT EST's, the thickness of the n$^-$-drift zone 104 is selected to be smaller than the width the space charge region has at a given maximum blocking capability of the component. In order to prevent accumulation of the space charge region onto p$^+$-emitter 105 and a current flow connected thereto, n-doped buffer zone 150 is incorporated here with the aim of avoiding the punch-through. This leads to the trapeze-shaped pattern of the electrical field strength |E| along the y-coordinate, indicated in FIG. 9 and FIG. 10. The maximum of the field strength is here, too, in the range of MOS control heads 106, 107, 108, 160, 180. Besides preventing punch-through, n-buffer zone 150 also makes possible the setting of the emitter efficiency, and thereby the forward current behavior and the switching behavior of the PT EST's.

The fact that the field maximum lies in the range of MOS control heads 106, 107, 108, 160, 180, is of disadvantage for the several applications so that it would be helpful to optimize the unfavorable field strength distribution using suitable measures.

German Patent No. 198 16 448 purportedly relates to a general purpose semiconductor wafer for high voltage components such as V-IGBT's, in which on an n-doped semiconductor substrate, at least one n-doped epitaxial layer is provided. A plurality of floating, p-doped semiconductor regions are embedded in the border areas between the substrate and the at least one epitaxial layer, which are dimensioned in such a way that the dimension size of a floating region is small compared to the layer thickness of the at least one epitaxial layer, and is approximately equivalent to the distance between the floating regions in a border area, or smaller. In this context, the floating regions lying in one plane can be connected to one another so that they form a lattice. In the example of the V-IGBT, one assumes that, in the active region of the V-IGBT, when a blocking voltage is applied, the charge carriers are not completely depleted from the floating p-regions.

German Patent No. 198 40 032 refers to a MOS transistor (e.g. an n-channel V-DMOS) having a non-floating compensating structure in the n-drift zone. The compensating structure and/or the n-drift region are doped in such a way that the degree of compensation toward the depth of the component changes in monotone fashion (continuously or stepwise) as follows. During passing of the compensation structure from source to drain, on the source side the p-doping dose outbalances the n-doping dose, whereas at the drain side end of the compensating structure the n-doping dose outbalances the p-doping dose. Under a blocking voltage, a hump-shaped field distribution sets in which has its maximum approximately in the middle of the vertical extension of the compensation structure, where n-doping dose and p-doping dose are exactly compensating. Between the drain-side end of the compensating structure and the n-substrate, a low-doped n-layer may optionally be positioned. In each case the purpose is an increased process security and a heightened robustness in the breakdown.

German Published Patent Application No. 196 04 043 purportedly refers to influencing the field distribution in an MOS transistor or a V-IGBT with the aid of n-doped and p-doped regions embedded in the drift zone, in order to reduce the forward current voltage drop at a given blocking capability. In this context, the overall quantity of the doping of the embedded n-regions is approximately equal to the overall quantity of the doping of the embedded p-regions. The embedded regions, in this case, may be statistically distributed or configured as ball-shaped, strip-shaped or thread-shaped regions, and may be embedded pairwise. Their distance apart may be greater than, or equal to zero, but less than the space charge region. The p-regions are designed to be floating. In the case of statistically distributed p-regions and n-regions, the average concentration of the distributed p-regions are of equal or greater size than that of the embedded n-regions.

For manufacturing, a method is proposed which, beginning with a raw wafer, generates the p-doped and n-doped regions in the n-drift zone by a multiple sequence of epitaxy, implantation and diffusion.

FIG. 11 shows what is believed to be a typical circuit topology used for IGBT's in ignition applications, which would also be suitable for EST's. If one were to use an EST as previously described in such a topology as the switching element, there may be difficulties with the pulse stability of the component. These problems will be described after a brief explanation of the functionality of the circuit.

In the ignition application, a switching element 900 having a typical blocking capability of 400–600 V and connections cathode 901, anode 902 and gate 903 is connected to battery voltage 911 via an ignition coil 912. On the secondary side of ignition coil 912 a spark plug 913 is connected. Diode 904 is used for protection of the EST, and optionally present diode 906 prevents current flow from gate to anode, in the forward current case. Resistors 907, 914, having, for example R907 of approximately 1 kΩ and R914 in the range of 10 to 25 kΩ, define the input resistance of the apparatus, and on the other hand, generate the load of clamping diode 905, which, when IGBT's are used as switching elements is usually designed as a string of polysilicon Zener diodes polarized in the blocking direction. Elements 904, 905, 906, 907, 914 are usually monolithically integrated, with the diodes 904, 906 normally being made of polysilicon.

The circuit configuration is directly operable by a control unit via control terminal 908. For this, a positive voltage such as 5V is connected to 908, whereupon a conducting path is opened between electrodes 901, 902 of the switching element and a current increase through the ignition coil is initiated. At a certain point, the voltage at control terminal 908 is reduced to about 0 V, whereupon the conducting path between electrodes 901, 902 of the switching element vanishes, and the voltage at nodes 902, 909 rises steeply. The voltage increase is transformed upward onto the secondary side of ignition coil 912 and leads to an ignition spark at spark plug 913. Clamping diode 905 has the task of limiting the voltage increase at anode 902 to the so-called clamping voltage of approximately 400 V, so as to protect the switching element and the remaining circuit components. This is particularly important in the so-called pulse case.

This comes up when, for example, no ignition spark is generated as a result of an ignition cable having fallen off. Then switching element 900 must absorb the energy otherwise converted to the spark. Without a voltage limitation, the anode voltage would rise in this case at nodes 902, 909 up to the breakdown of the switching element, and would destroy it. This is prevented by the use of clamping diode 905 in that when a preselected clamping voltage of the switching element is reached, it drives via the control terminal just strongly enough that the exceeding of the clamping voltage at 902, 909 is avoided. Still, because of the high converted energy, this operating case represents a great demand on the pulse stability of the switching element, which cannot always be guaranteed in sufficient measure. The result is the destruction of the switching element.

When an EST as the switching element in the pulse case, the space charge region acquires the entire n-drift zone 104. Via a controlled activation of gate 103 using clamping diodes 905, 906, electrons are injected into the drift zone, via the developed MOS channel, which control p⁺-emitter 105. As a result of the high current density, the high electrical field strength and thus of the high power loss in the region of the MOS control heads, the component becomes very hot, especially at the cathode, whereupon an electron leakage current from the MOS control heads comes about. The electrons run in the direction of the anode and drive high p⁺-emitter 105. Thus, they act as an additional drive of the EST. In order to keep the voltage to the value of the clamping voltage, the control of gate 103 is correspondingly reduced via clamping diode 905.

Under certain operating conditions, the driving by the thermally conditioned electron leakage current is so strong that the EST can carry the load current without the gate being driven high (this is favored especially when the emitter efficiency increases with increasing temperature). The controllability of the EST is lost, the temperature continues to increase, and the leakage current continues to increase. Finally, a thermal feedback comes about, and the EST may be destroyed.

SUMMARY OF THE INVENTION

The semiconductor power component and the corresponding manufacturing method have the advantage that a robust EST having high pulse stability is made available.

It is believed that the semiconductor power component according to the present invention is more easily produced than the structures referred to in German Patent Application No. 196 04 043 ('the '043 application') and has an increased pulse stability compared to the structures referred to in German Patent No. 198 40 032 ('the '032 patent'). The semiconductor power components according to the present invention also permit, in particular, small half cell widths in a simple manner.

The present invention provides that drift zones of the first conductor type in strip form or column form, which are embedded in the drift zone of the second conductor type, are provided, which are connected, for example, via a body region of the first conductor type, having contact diffusion of the first conductor type, to the cathode metal, so that its potential does not float. Upon take-up of blocking voltage, they are used for charge compensation.

Compared to the structures referred to in the '043 application in which two different (n- and p-)doped zone types are to be incorporated, the structures according to the present invention are easier to manufacture, since only one further type of drift zone is incorporated into the drift zone.

Moreover, the structures proposed here differ from those referred to in the '043 application in that the entire net dose of the drift zones of the first conductor type, incorporated into the active region of the ETS, e.g. per half cell, is greater than the net dose of the parts of the drift zone of the second conductor type situated in the active region, between the drift zones and the first conductor type.

The structures according to the present invention differ from those referred to in the '032 patent in that the degree of compensation K(y) does not decline monotonically into the depth of the component from first semiconductor surface y=0 with y increasing. Rather, the degree of compensation is set in such a way that it has a maximum in the region of the end of the first conductor type, that is at a distance from the first semiconductor surface, and the drift region of the first conductor type is completely depleted of load carriers before an avalanche breakdown occurs.

According to one exemplary embodiment, a buffer region of the second conductor type is provided between the first drift region and the emitter region on the reverse side.

According to a further exemplary embodiment, a contact region of the first conductor type encloses the source region partially.

According to a further exemplary embodiment, the first body region and the source region, on the one hand, and the third drift region, on the other hand, run in the form of a strip, and not parallel to one another.

According to yet another exemplary embodiment, the third drift region encloses a trench filled with an insulating material.

According to still another exemplary embodiment, the first conductor type is of n-type and the second conductor type is of p-type.

DETAILED DESCRIPTION

Figure 1:
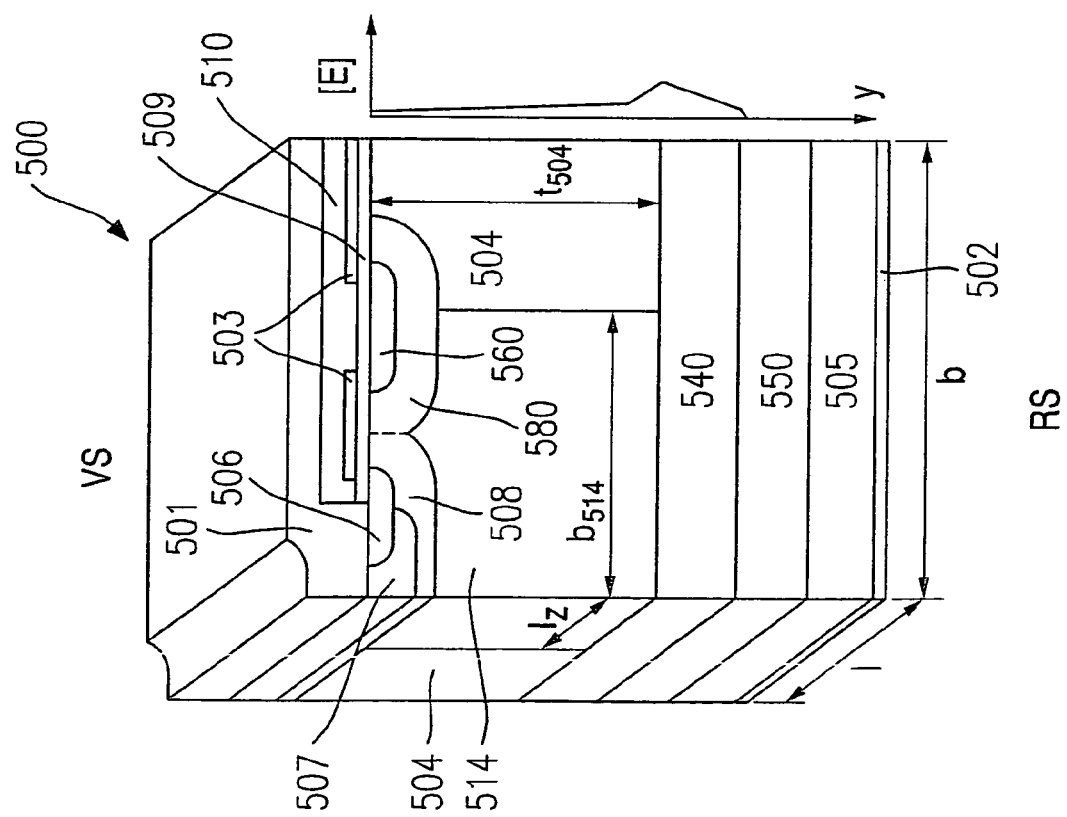
FIG. 1 shows a schematic cross section of a semiconductor power component according to a first exemplary embodiment of the present invention.

FIG. 1 shows a schematic cross section of a semiconductor power component according to a first exemplary embodiment of the present invention.

For the following description, it is of advantage to introduce the degree of compensation K(y) as follows:

$$K(y)=Sp(y)/Sn(y)-1$$

Here y is the coordinate pointing from the first semiconductor surface in the direction of the reverse side of the chip, and $$Sn(y)=\int\int ND(x,y,z)dxdz$$

$$Sp(y)=\int\int NA(x,y,z)dxdz$$

The integration is to be extended here in each case in the Cartesian coordinates x and z, orthogonal to y, over the entire active region of the component, which is composed of a plurality of parallel-connected cells (cross section, in each case, of a half cell, see FIG. 1 to FIG. 4). ND(x,y,z) and NA(x,y,z) are the donor and acceptor concentration, respectively, at a point P(x,y,z) within the component.

FIG. 1 shows a cutout 500 from the active region of a EST, having a width b and a length l. In the region of the n/p-drift zones 504 and 514, which are situated next to each other, a degree of compensation K(y)>1 is set, which has a maximum in the region of the end of p-drift region 514 which is at a distance from the semiconductor surface on the front side. The entire active region is obtained by mirroring the sketched structure several times at its clamping surfaces.

In FIG. 1, 501 is the cathode metallization, 502 the anode metallization, 503 the bipartite gate whose two parts are connected to each other via the third dimension, and which may be made of polysilicon, 514 the p-drift zone of width $b_{514}$ and length $l_z$, 504 a first part of the zone of depth $t_{504}$ optionally having a non-constant doping, 540 a second part of the n-drift zone optionally having a different doping concentration compared to 504, 550 an optional n-region having an increased doping concentration compared to 540, which, for example, can act as a buffer, 505 a $p^+$ region used as emitter, 506 an $n^+$-doped source region, 560 an $n^+$-doped emitter region, 507 a $p^+$-contact diffusion which extends partially below 506 and is used additionally for decreasing the latch-up sensitivity of the EST, 508 and 580 a first and second p-body region at whose surface, which is covered by gate oxide 509, an inversion channel is able to be formed, and 510 is an intermediate oxide which is used for insulating between 501 and 503.

Passivating layers of nitride or polyimide, which are customary, are situated on cathode metallization 501, but are not drawn in here, for reasons of clarity. For the dimensions of p-drift zone 514, generally, $l_z$ is less than, or equal to 1 applies, and $b_{514}$ is less than, or equal to b, where $l_z$ and $b_{514}$ are always to be selected in such a way that a vertical path of n-drift zone 504 passing through from the front semiconductor surface to region 540 is maintained, via which a current flow of electrons is possible.

In general, it is conceivable not to design the width $b_{514}$ and/or the length $l_z$ and/or the doping of 504, 514 identically in each half cell, so that, for example, not each half cell is furnished with a p-drift zone 514. However, for homogeneous functionality of the individual half cells among one another, this may not be necessary. Therefore, in the following explanation of the function, the simplifying assumption is made that all half cells in the active region are designed identically.

In the forward current case, the function is analogous to the SC-EST as described above. Gate 503, which is insulated from the semiconductor only by a thin gate oxide layer 509, is brought to a potential with respect to the cathode terminal 501, above the threshold voltage of the MOS control heads. Thereupon, in the region of p-body regions 508, 580 and, provided $b_{514}$ is correspondingly wide, of p-drift zone 514, an inversion channel is generated at the semiconductor surface under gate oxide 509. The semiconductor surface in the region of the n-drift zone 504 is then in the accumulation state.

In the case of a positive anode voltage at anode terminal 502 compared to cathode terminal 501, electrons are injected via $n^+$-regions 506, the electrostatically induced MOS channels and the accumulation layer into n-drift zone 504. As a result, $p^+$-emitter 505 injects holes. From a certain current density and higher, the thyristor structure, which is made up of regions 560, 580, 514, 504, 540, 550, 505, fires, whereby n-drift zone 540 and, depending on the amount of doping, also p/n-drift zones 514 or 504 are so flooded with charge carriers that the conductivity is increased by the mechanism of high injection. Thereby, good forward current properties are achievable. In this context, the current through the EST remains controllable via the gate cathode voltage.

In the blocking case, the procedure runs as follows. Gate 503 is brought to a voltage below the threshold voltage, with respect to cathode terminal 501. If anode terminal 502 is now brought to a positive potential, the space charge region developed at the border between p-drift zone 514, and n-drift zone 504, 510 expands into n-drift zones 504, 540 more strongly than into p-drift zone 514, because K(y)>1. Only at large blocking voltages of the order of magnitude of the breakdown voltage is p-drift zone 514 completely cleared of charge carriers.

For the case of an NPT (non-punch-through) structure, region 550 is omitted and the thickness of n⁻-drift region 540 is selected to be greater than the width the space charge region has at a specified maximum blocking capability of the component in n⁻-drift region 540.

This leads to the pattern of electrical field strength |E| along the y-coordinate, indicated in FIG. 1. It is useful for the maximum of the field strength to be present not in the region of the MOS control heads, but approximately at a depth $t_{504}$ at the floor of p-drift zone 514. This is achieved, in principle, by the degree of compensation K(y)>1 chosen. Furthermore, high field strengths in the region of the MOS control head are effectively prevented by having the degree of compensation K(y) have its maximum in the region of the end of p-drift zone 514 which is at a distance from the front semiconductor surface.

In the case of a PT (punch-through) structure, n-region 550 is present and may be used either to optimize the emitter efficiency and the switching behavior, and/or the thickness of n-drift region 540 may be selected to be smaller than the width which the space charge region would have at a given maximum blocking capability of the component in the n-drift region. Then n-region 550 may be used to prevent a punch through of the space charge region on p⁺ emitter 505.

This leads to a pattern of electrical field strength [E], similar to the one in FIG. 1, along the y-axis, the field, however, not penetrating far into n-region 550. It is also useful in this case for the maximum of the field strength to be distanced far from the MOS control head region, approximately at a depth $t_{504}$ at the floor of p-drift zone 514.

Figure 11:
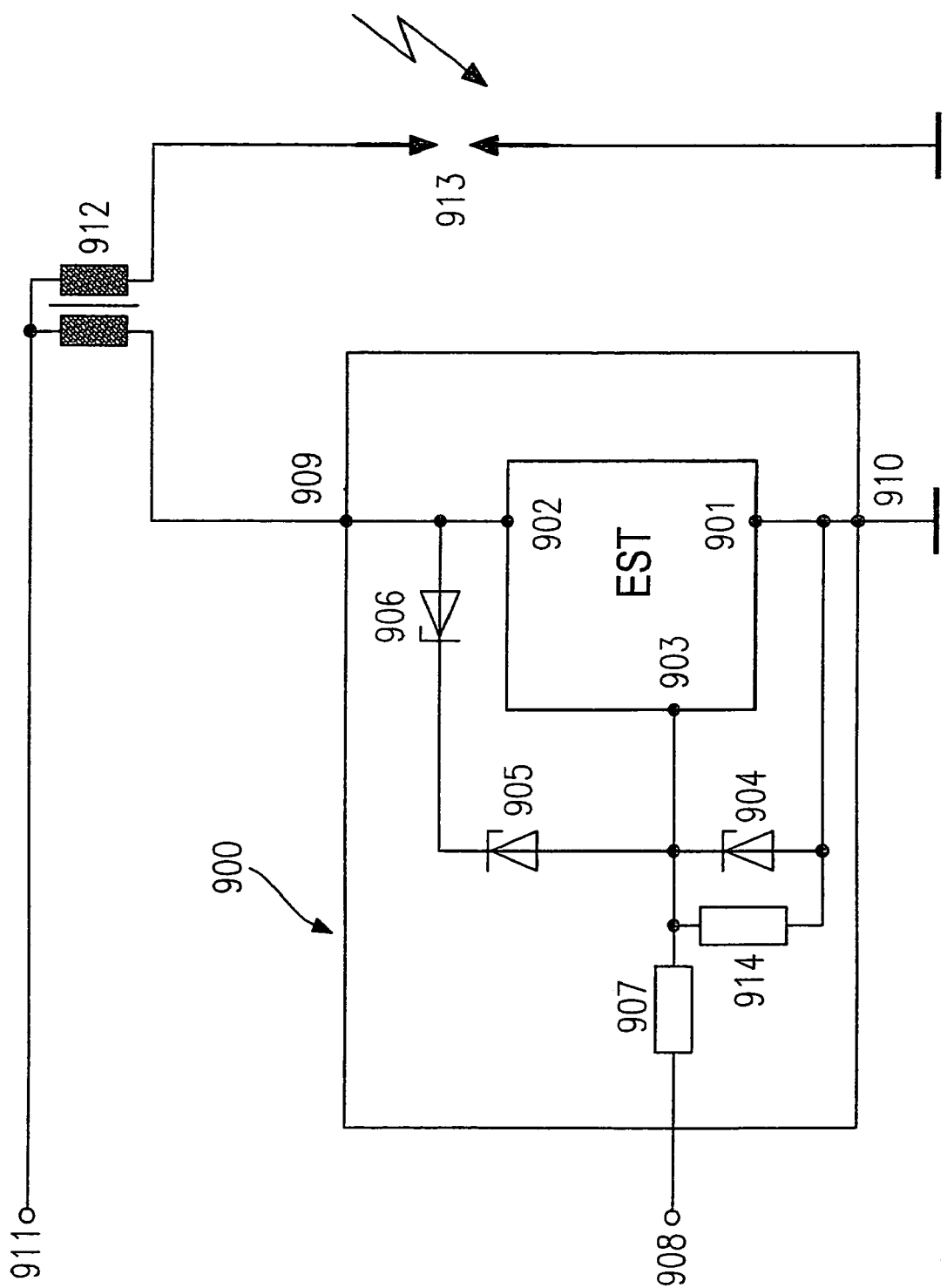
FIG. 11 shows a circuit topology in which an EST is used as ignition switch in the primary circuit of an ignition coil for an internal combustion engine.

In the pulse case, the EST is operated in a circuit according to FIG. 11, and it is assumed for illustrative purposes that no ignition spark is able to be generated. The procedure is analogous to the EST as described above. However, because of the special structure of the EST according to the present invention, the field maximum and the location of greatest heat generation are at the depth of the semiconductor. Thus, it takes a certain time until the MOS control head region is engaged by the heat front after the pulse case sets in, and only clearly later does it come to the above-described thermal feedback, which initiates the destruction of the component. Because of this additional time which the EST survives according to this specific embodiment in the pulse case, it is believed that it achieves a clearly greater pulse resistance than heretofore demonstrated.

Figure 2:
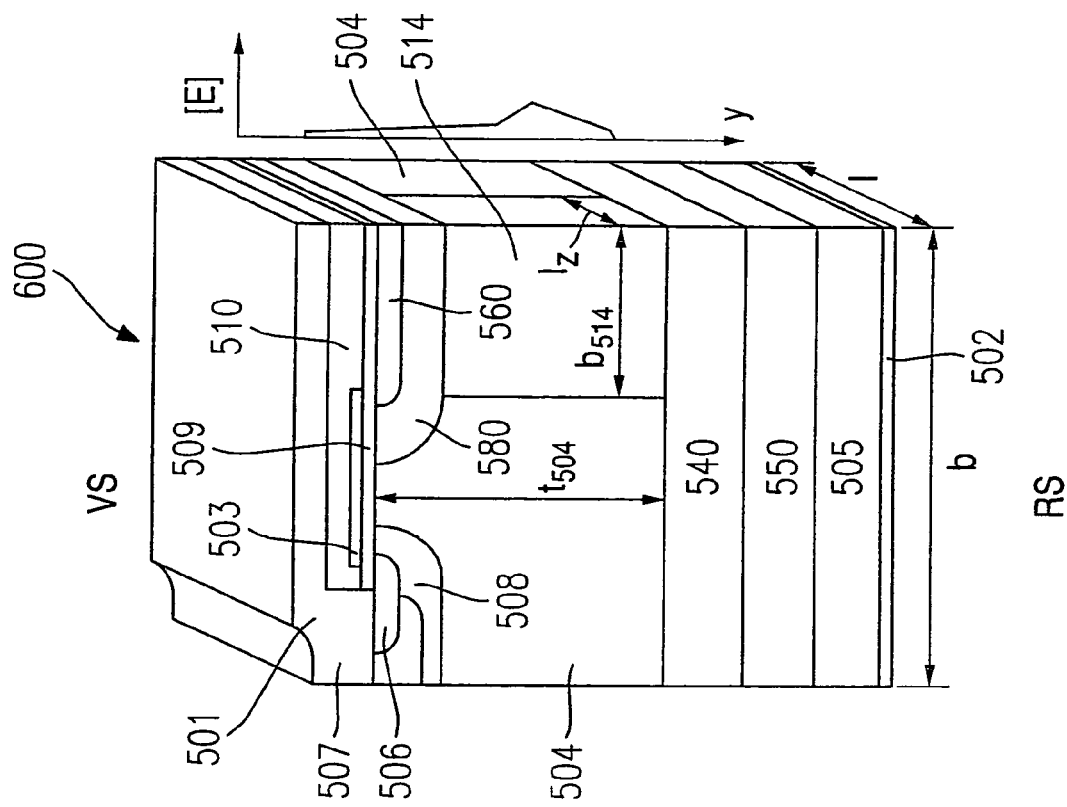
FIG. 2 shows a schematic cross section of a semiconductor power component according to a second exemplary embodiment of the present invention.

FIG. 2 shows a schematic cross section of a semiconductor power component of a second exemplary embodiment of the present invention.

Second specific embodiment 600 of the EST according to the present invention having or not having n-region 550 in FIG. 2 shows a DC-EST whose functioning procedure is analogous to that of the structure in FIG. 1. However, structure 600 shown in FIG. 2 advantageously has a higher FBSOA. In structure 600, p-drift zone 514 borders directly on second p-body region 580. In general, it is possible not to configure the width $b_{514}$ and/or the length $l_z$ and/or the doping of 504, 514 identically in each half cell, so that, for example, not each half cell is furnished with a p-(drift) region 514. However, for homogeneous functionality of the individual half cells among one another, this may not be necessary.

Two further exemplary embodiments of the semiconductor power component according to the present invention may be derived from FIGS. 1 and 2 by selecting $b_{514}=b$ and $l_z<1$. These variants have advantages when it comes to their manufacture, as will be explained later, in connection with FIGS. 5a–e.

Figure 4:
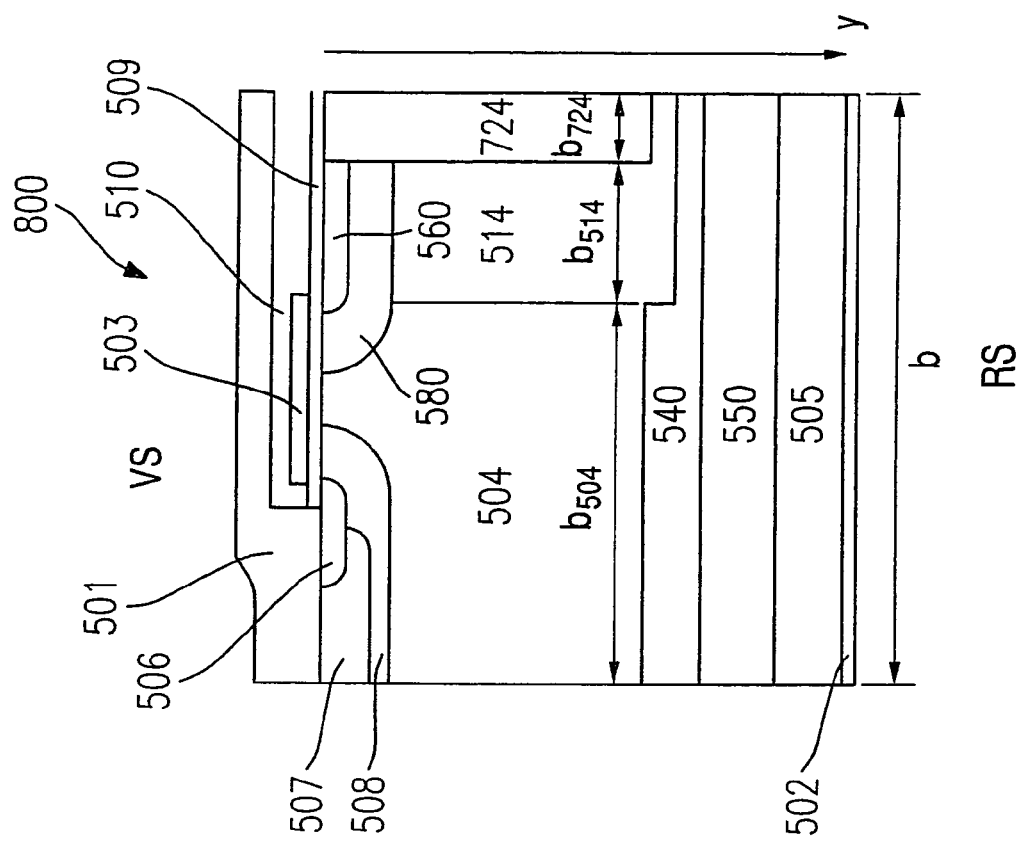
FIG. 4 shows a schematic cross section of a semiconductor power component according to a fourth exemplary embodiment of the present invention.
Figure 3:
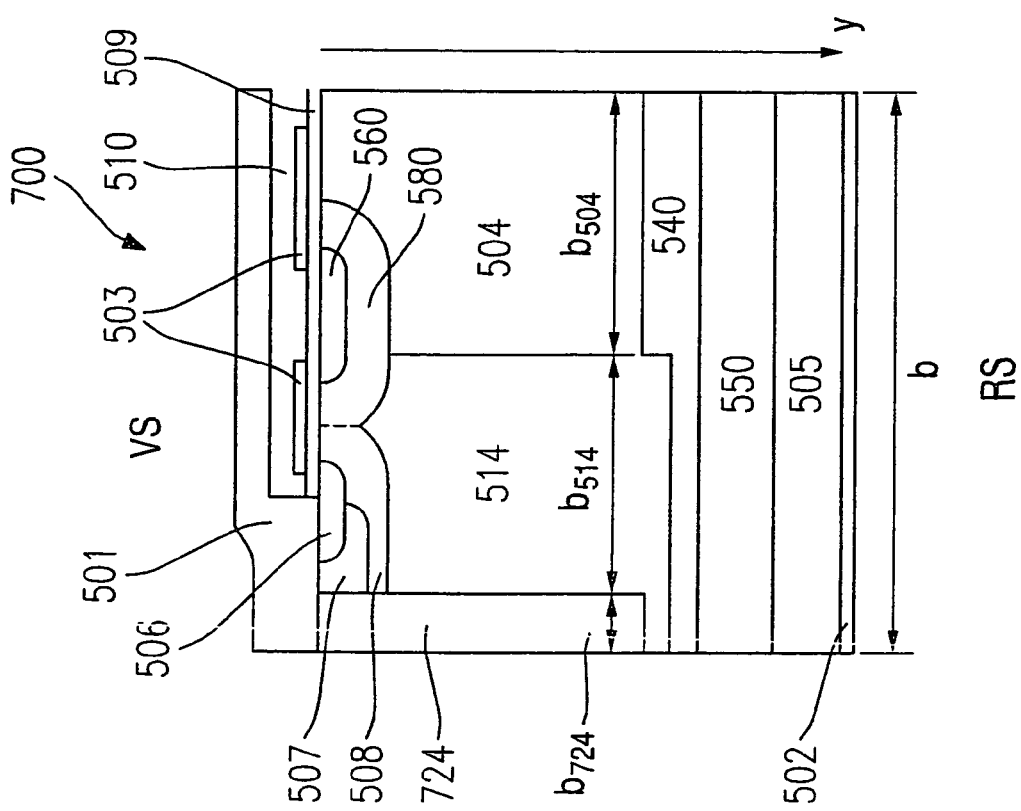
FIG. 3 shows a schematic cross section of a semiconductor power component according to a third exemplary embodiment of the present invention.

FIGS. 3 and 4 show in each case a schematic cross section of a semiconductor power component according to the third and fourth exemplary embodiments of the present invention, having an optional n-region 550, where FIG. 3 shows a SC-EST and FIG. 4 shows a DC-EST.

In the case of these structures which function analogously to FIGS. 1 and 2, p-drift zones 514 are produced with the aid of a deep trench or groove 724, which may optionally be filled with a dielectric or polysilicon. A possible process flow for its production will be explained below, in connection with FIGS. 6a–e. For the structures shown in FIGS. 3 and 4 it is useful that the degree of compensation K(y)>1 is set in such a way that it has a maximum in the region of the end of the p-drift zones 514 that is at a distance from the first semiconductor surface, and furthermore, that a traversing vertical path of region 504 is maintained from the front semiconductor surface to n⁻-drift zone 540, via which a current flow of electrons is possible.

FIGS. 5a–e illustrate process steps of an exemplary embodiment according to the first and second exemplary embodiments, respectively.

A starting point is, for example, a p⁺-substrate 505a having an optional first n-layer 550a produced upon it, on which a part of n-drift zone 540a has been deposited by epitaxy.

Alternatively, one may also use an n-substrate having p⁺-reverse side diffusion or an n-substrate having a p⁺-epitaxy layer.

Figure 5A:
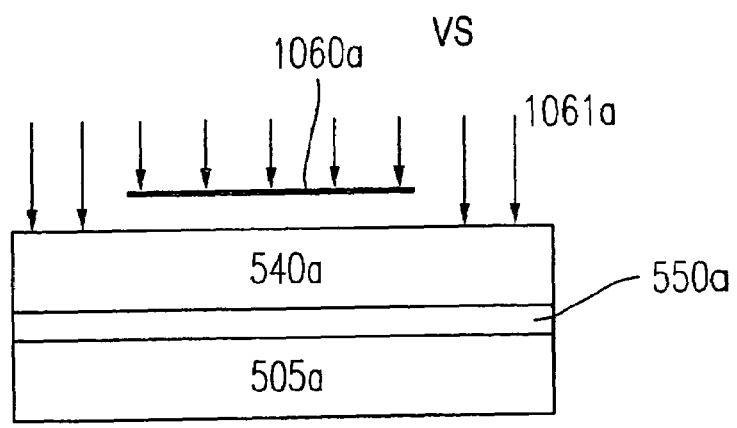
FIG. 5a–e show process steps of the method of producing a semiconductor power component according to first and second exemplary embodiments of the present invention.
Figure 5B:
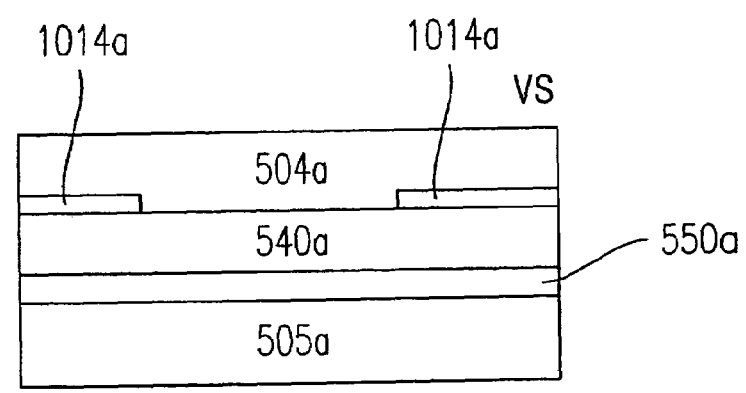
Figure 5C:
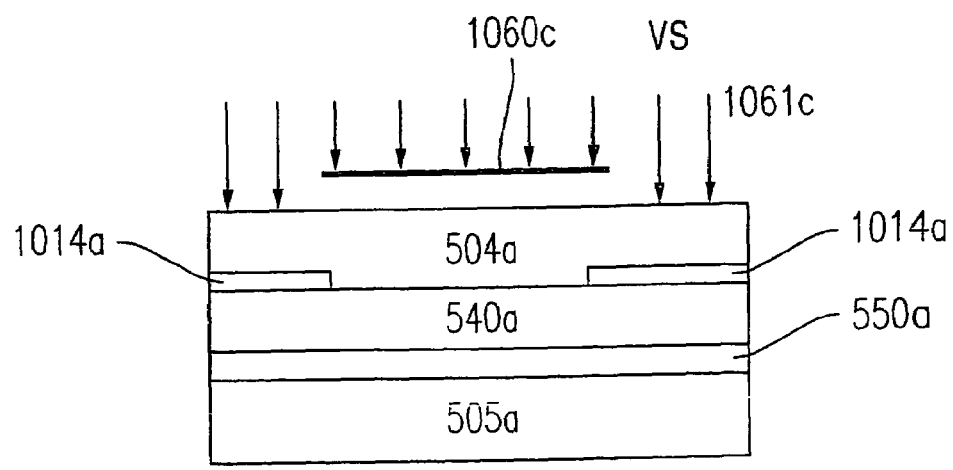
Figure 5D:
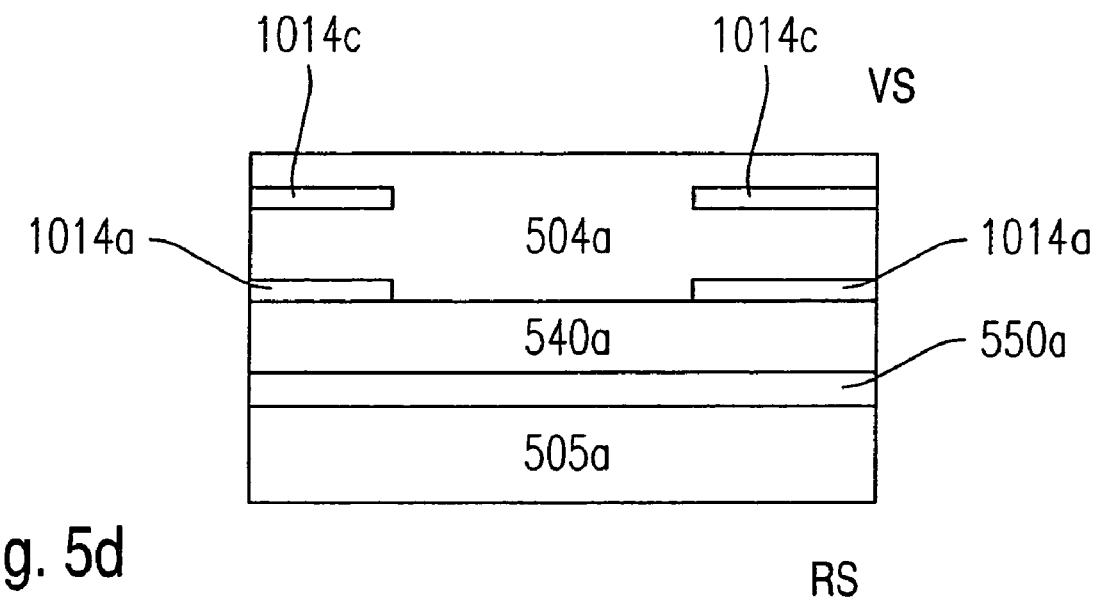

In the subsequent operation shown in FIG. 5a, a p-layer 1061a is implanted, which is structured with the aid of a photomask 1060a. As shown in FIG. 5b, there is subsequently carried out the growing of a partial thickness of n-drift zone 504a, the previously implanted p-regions 1014a diffusing out to a certain degree. As shown in FIG. 5c, there now takes place a renewed p-implantation 1061c, structured using photomask 1060c, above regions 1014a for producing p-regions 1014c (not shown here). There follows an epitaxial growth of a further partial thickness of n-drift zone 504a, p-regions 1014a, 1014c incorporated before diffusing out again a small amount. This operational step sequence implantation and subsequent epitaxy is repeated until n-drift zone 504a has reached a target thickness (see FIG. 5d), which may be specified, for example, based on the desired pulse resistance.

In this context, the desired degree of compensation K(y) may be set by a corresponding selection of implantation doses and/or window widths in the photomasks and/or variable doping during epitaxy.

On the wafer thus preprocessed, standard manufacturing methods of semiconductor technology may be used subsequently to manufacture all the further necessary structures from the wafer according to the first or the second exemplary embodiments.

As compared to the method referred to in the '043 application, the manufacturing process according to the present invention is less costly, since only the p-dopings using photomasks are to be structured. The n-doping needed for the function is made available directly with the aid of epitaxy.

Figure 5E:
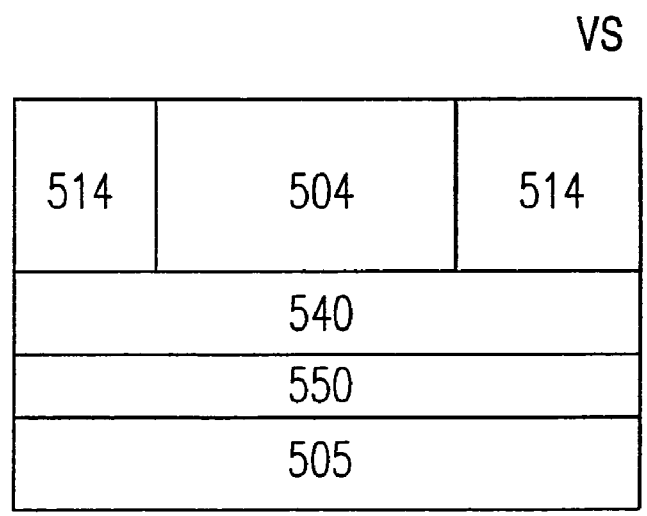

Lastly, as shown in FIG. 5e, a drive-in step takes place, in which previously implanted p-regions 1014a, 1014c diffuse out. In this context, as shown, they fuse with one another to form p-drift zone 514. Regions 505*a*, 550*a*, 540*a* and 504*a* then become corresponding regions 505, 550, 540 504, which were explained above with reference to FIGS. 1 and 2. The preparation of the MOS control heads is finally carried out in a known manner.

It is the aim of such an effective manufacturing method to make do with as few implantation/epitaxy sequences as possible. However, in view of the developing trend toward ever smaller half cell widths, this desire has limits set to it. For, if one wished, for reasons of homogeneity of the physical processes in the active region of the EST, to assign to each half cell an identical p-drift zone, and to produce this using as few as possible implantation/epitaxy sequences, one should choose a big vertical outdiffusion of the implanted p-regions. This means, however, as a countermove because of K(y)>1 that there will be a great lateral outdiffusion.

Because of that, under the above boundary conditions, limits are set to the diminution of the cells. This difficulty may be sidestepped in that, in a set-up using strip-shaped p-body regions 508, 580, the p-drift zones 514 may be strip-shaped as well, and arranged non-parallel and possibly orthogonally to the former.

This is achieved in FIGS. 1 and 2 by selecting $b_{514}=b$ and $l_z<1$. This kind of positioning MOS control heads and compensation structures (p-drift zones) with respect to each other is not limited to EST's, but may also be used in the case of other vertical components, such as vertical MOS transistors having compensation structures.

FIGS. 6*a*–*e* illustrate process steps of an exemplary embodiment of the method of production according to the present invention for the semiconductor power component according to the third and fourth exemplary embodiments, respectively.

Figure 6A:
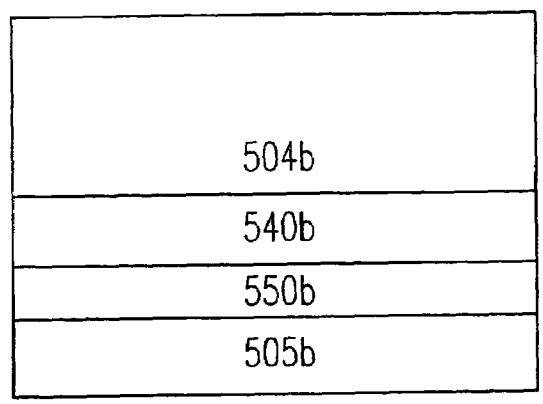
FIG. 6a–e show process steps of the method of producing a semiconductor power component according to third and fourth exemplary embodiments of the present invention.
Figure 6B:
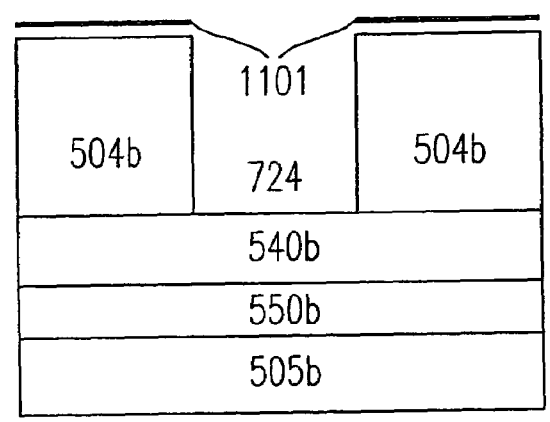
Figure 6C:
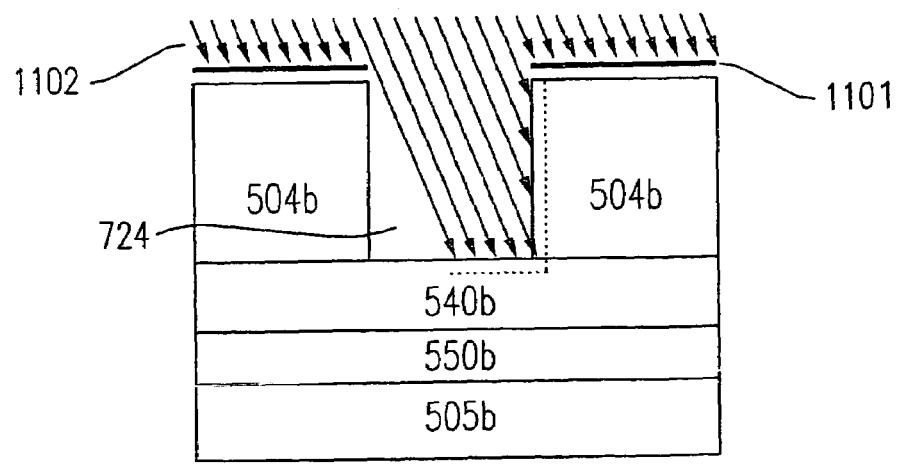
Figure 6D:
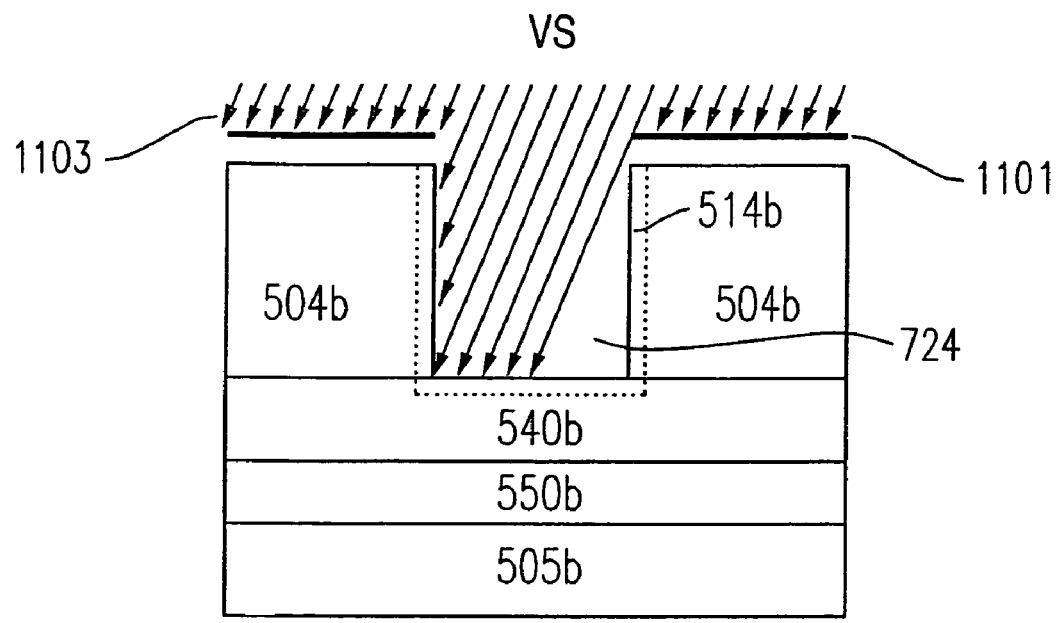
Figure 6E:
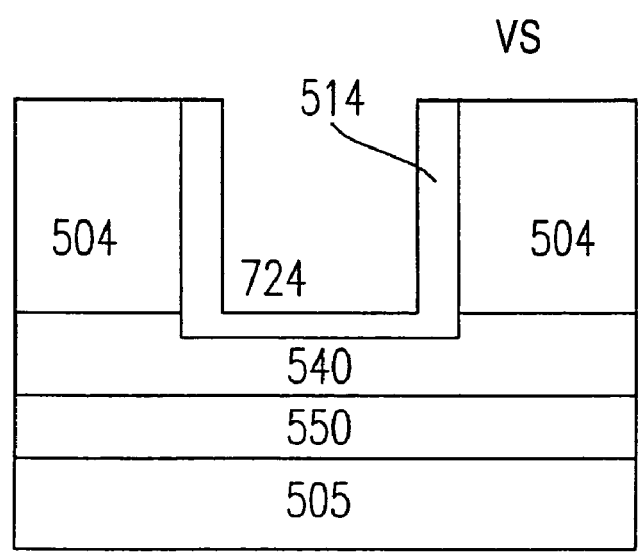
Figure 8:
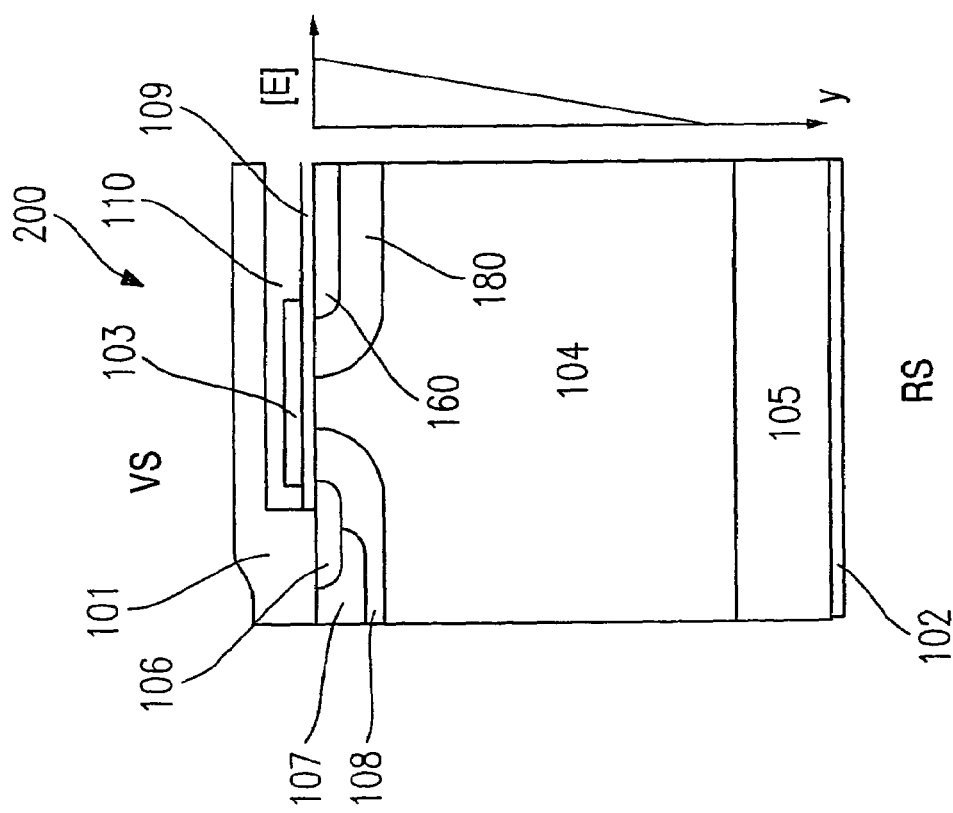
FIG. 8 shows a schematic cross section of a DC-NPT EST.
Figure 7:
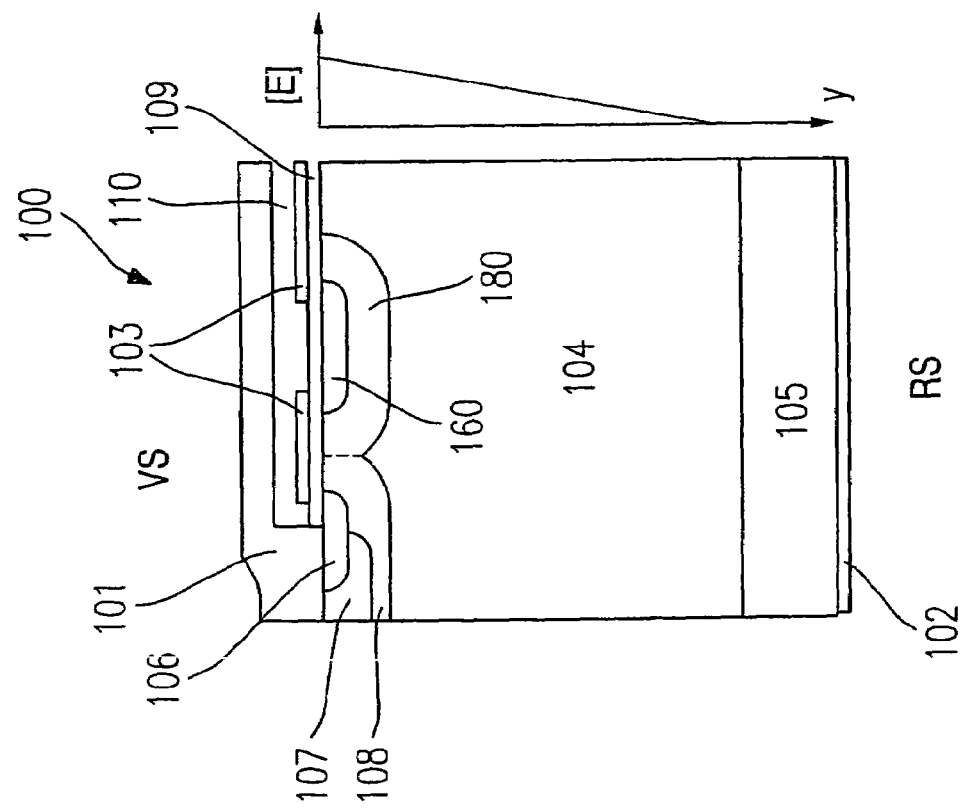
FIG. 7 shows a schematic cross section of an SC-NPT EST.
Figure 10:
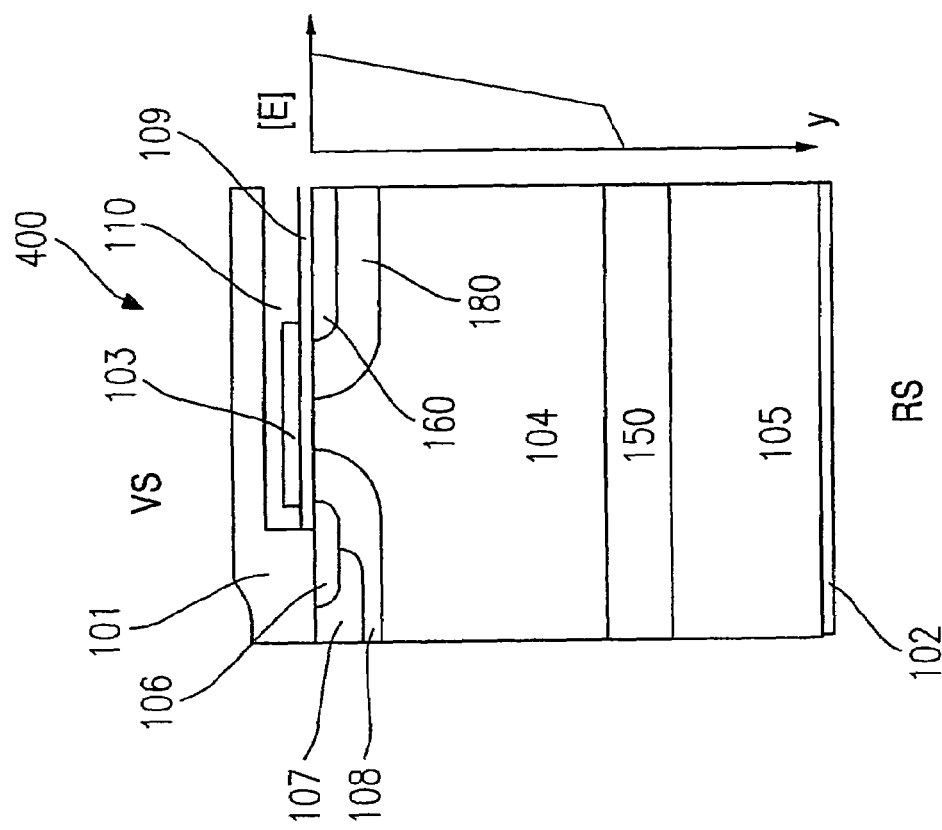
FIG. 10 a schematic cross section of a DC-NPT EST.
Figure 9:
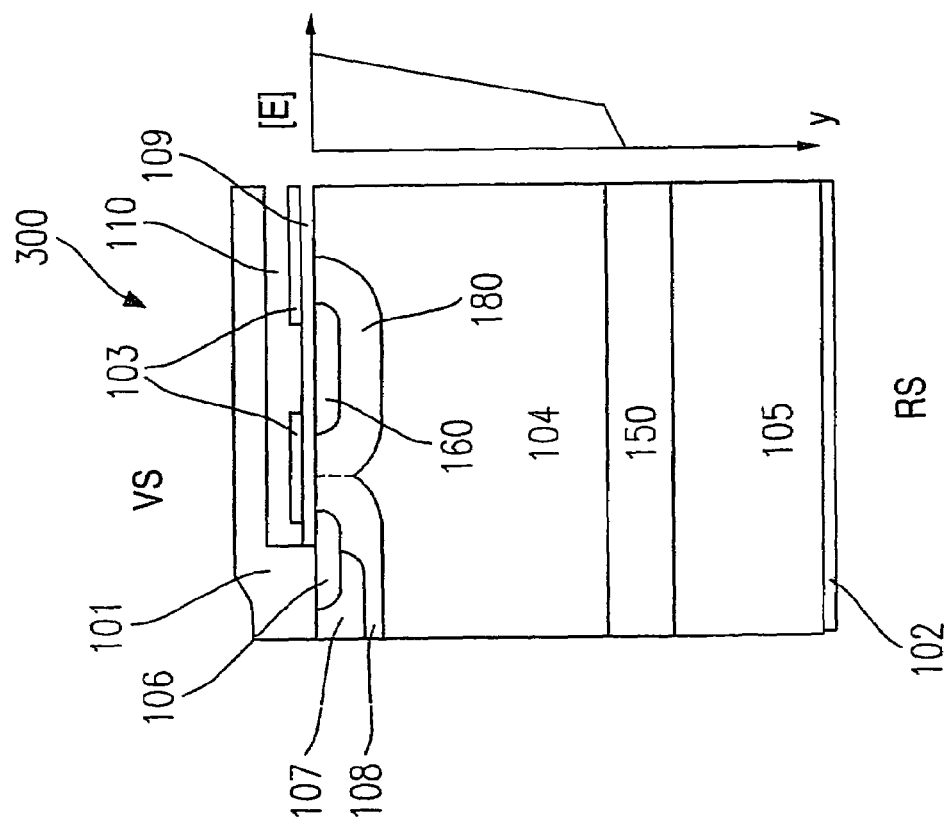
FIG. 9 shows a schematic cross section of a SC-PT EST.

In a wafer according to FIG. 6*a*, having the sequence of coatings n-drift zone 504*b*, n-region 540*b*, optional n-region 550*b* and p$^+$-emitter 505*b*, according to FIG. 6*b*, trenches 724 are etched from the upper side of the wafer, a mask 1101 being used for structural imaging. These may have vertically running parallel sidewalls. However, they may also have slanting sidewalls, so that they are v-shaped in cross section or U-shaped, having a width that becomes greater in the upward direction.

By the use of two subsequent p-implantations 1102, 1103 at equal angles to the y-direction, p-dopings 514*c*, 514*d* may be incorporated into the walls and the bottom of trenches 724 in such a way that K(y)>1. By an appropriate choice of width of trench and implantation angle it may further be achieved that the degree of compensation has a maximum at the height of the bottom of trenches 724. Subsequently, after the removal of mask 1101 and filling up trenches 724, e.g. using a dielectric, p-regions 514 may be produced by outdiffusion. Regions 505*b*, 550*b*, 540*b*, and 504*b* then turn into corresponding regions 505, 550, 540 and 504, which were explained above, with reference to FIGS. 3 and 4. The preparation of the MOS control heads is finally performed in a known manner, using standard process steps of semiconductor technology.

In order to optimize the dynamic properties of the component, process steps which reduce carrier service life may be inserted into the process flows according to FIGS. 5*a*–*e* or FIGS. 6*a*–*e*.

Although the present invention was described above with the aid of an exemplary embodiment, it is not limited thereto.

For instance, if one exchanges the doping types and the signs of the voltage to be applied, a corresponding p-channel EST is obtained from the n-channel EST. In general, the former is superior to the n-channel EST with respect to the latch-up resistance, but inferior with respect to the avalanche resistance.

The invention claimed is:

1. A semiconductor power component including a front side and a reverse side, comprising:
    an anode contact situated on the reverse side;
    an emitter region having a first conductor type situated on the reverse side and coupled to the anode contact;
    a drift zone coupled to the emitter region and partially extending toward the front side, the drift zone including a first drift region having the second conductor type, a second drift region having the second conductor type and a third drift region having the first conductor type, the first drift region being a buried region, the second drift region coupling the front side to the first drift region;
    an MOS control structure including:
        a source region having the second conductor type,
        a first body region having the first conductor type,
        an emitter region having the second conductor type,
        a second body region having the first conductor type, the second body region enclosing the emitter region, and
        a control contact,
        wherein each of the source region, the first body region, the emitter region and the second body region are incorporated into the drift zone, the second body region bordering on the first body region, the control contact being situated in an insulating manner above the second body region, above and bordering a part of the drift zone and reaching the front side, above the first and the second body regions and between the source region and the emitter region; and
    a cathode contact situated on the front side and coupled to the source region and the first body region;
    wherein the third drift region couples the first body region and the second body region to the first drift region, and a degree of compensation determined by the second drift region and the third drift region is greater than one and has a maximum in a region of a side of the third drift region facing away from the front side.

2. The semiconductor power component of claim 1, further comprising:
    a buffer region having the second conductor type situated on the reverse side and between the first drift region and the emitter region.

3. The semiconductor power component of claim 1, further comprising:
    a contact region having the first conductor type partially enclosing the source region.

4. The semiconductor power component of claim 1, wherein the first body region and the source region and the third drift region are strips that do not run parallel to each other.

5. The semiconductor power component of claim 1, wherein the third drift region encloses a trench filled with an insulating material.

6. The semiconductor power component of claim 1, wherein the first conductor type is n-type and the second conductor type is p-type.

* * * * *